United States Patent [19]

Broughton

[11] Patent Number: 4,605,908
[45] Date of Patent: Aug. 12, 1986

[54] DISABLE CIRCUIT FOR A PHASE LOCKED LOOP DISCRIMINATOR CIRCUIT

[75] Inventor: Christopher D. Broughton, Mesa, Ariz.

[73] Assignee: Motorola, Inc., Schaumburg, Ill.

[21] Appl. No.: 812,555

[22] Filed: Dec. 23, 1985

[51] Int. Cl.$^4$ .............................................. H03L 7/06
[52] U.S. Cl. ........................................ 331/8; 331/11; 331/17
[58] Field of Search ................... 331/8, 10, 11, 14, 17, 331/DIG. 2

[56] References Cited

U.S. PATENT DOCUMENTS

| | | | |
|---|---|---|---|
| 4,000,476 | 12/1976 | Walker et al. | 331/17 |
| 4,423,390 | 12/1983 | Waters | 331/4 |
| 4,486,717 | 12/1984 | Yamasaki | 331/4 |

Primary Examiner—Eugene R. LaRoche
Assistant Examiner—D. C. Mis
Attorney, Agent, or Firm—Raymond J. Warren

[57] ABSTRACT

The present invention consists of an apparatus comprising a phase locked loop and a frequency loop having a discriminator and a disable. The disable is used to electrically disconnect the frequency loop from the phase locked loop when the phase of the output from the voltage controlled oscillator is within a preset range of the incoming signal. The disable acts to provide an adjusting voltage signal, set by the discriminator, to the phase locked loop when the output and input signal phases are out of the preset range. When they are within the preset range the disable outputs a zero voltage regardless of the input from the discriminator.

22 Claims, 8 Drawing Figures

DISABLE CIRCUIT FOR A PHASE LOCKED LOOP DISCRIMINATOR CIRCUIT

BACKGROUND OF THE INVENTION

This invention relates, in general, to phase locked loops and, more particularly, to discriminator circuits for phase locked loops.

A phase locked loop is used to maintain a constant phase between input and output signals. If these two signals are out of phase the output of the phase detector is adjusted to compensate for this and places the signals in phase. A phase locked loop, generally, can only adjust an output signal if it is within a certain frequency range of the incoming signal. If the differences in the output and input phases fall outside this range additional circuitry is needed to assist the PLL in locking onto the phase of the incoming signal. This additional circuitry is generally called a discriminating circuit, or frequency loop, and is used to provide course tuning to the PLL where the PLL itself provides a fine tuning.

Once the input and output signal frequencies fall within the range of the fine tuning of the PLL, the discriminating circuit, or frequency loop, must be decoupled from the PLL itself. This is done with the use of a disabling circuit. The disabling circuits now known in the art have an excessive amount of parts requiring more space and higher cost.

SUMMARY OF THE INVENTION

Accordingly, it is an object of the present invention to provide a phase locked loop discriminator circuit that overcomes the above deficiencies.

A further object of the present invention is to provide a phase locked loop discriminator circuit the requires fewer parts.

Another object of the present invention is to provide a phase locked loop discriminator circuit that requires less space.

Still another object of the present invention is to provide a phase locked loop discriminator circuit that is more economical to manufacture.

The above and other objects and advantages of the present invention are provided by the phase locked loop discriminator circuit described herein.

A particular embodiment of the present invention consists of a phase locked loop discriminator circuit comprising: a phase locked loop means for providing fine tuning in maintaining the phase between an input signal and an output signal; discriminator means for providing course tuning of the phase locked loop means; and disable means for disabling the discriminating means when the differences in phase between the input and output signals is within the limits of the phase locked loop

DETAILED DESCRIPTION OF THE DRAWINGS

Figure 1:
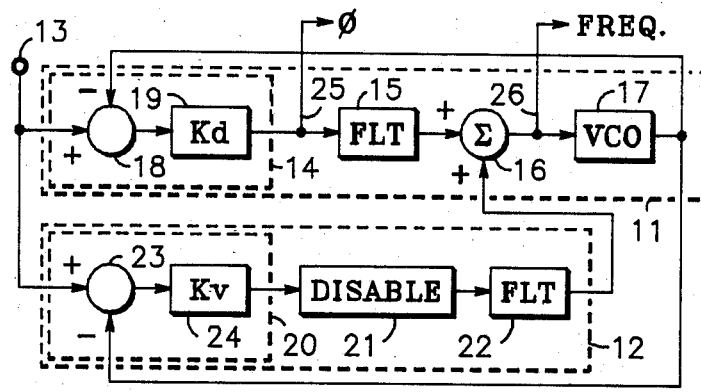
FIG. 1 is a block diagram of phase locked loop discriminator circuit embodying the present invention.

Referring now to the block diagram of FIG. 1, a phase locked loop discriminator circuit, generally designated 10, embodying the present invention is illustrated. Circuit 10 receives an input signal from a node 13 and consists of two major portions, a phase locked loop (PLL) 11 and a frequency loop 12. Phase locked loop 11 consists of a phase detector 14, a filter 15, a summer 16 and a voltage controlled oscillator (VCO) 17. Phase detector 14 of PLL 11 consists of a summing junction 18 and a gain constant 19. Frequency loop 12 consists of a discriminator 20, a disable 21 and an optional loop filter 22. Discriminator 20 consists of a second summing junction 23 and a second gain constant 24.

In operation, VCO 17 produces a signal dependent on the voltage at its input. This signal is transmitted to a second input of phase detector 14 where it is mixed with the incoming signal from node 13. The incoming signals to phase detector 14 are combined in summing junction 18 and the output provided to gain constant 19. The output of summing junction 18 is dependent on the difference in phase between the signals from node 13 and VCO 17. The larger the difference, in phase, the larger the output signal from summing junction 18. Gain constant 19 then amplifies the signal which is output from phase detector 14.

The output of phase detector 14 is then transmitted to the input of filter 15. Filter 15 filters out the noise from the input signal. If a phase signal output is desired from circuit 10 this can be taken from the output of phase detector 14 as shown by line 25.

The output of filter 15 is then transmitted to a first input of summer 16 where it is added to the output of frequency loop 12. The output of summer 16 is used as the input to drive VCO 17. The output of summer 16 is also used to provide an output for circuit 10 if a frequency signal is desired, as shown along line 26.

Frequency loop 12 provides the course tuning for circuit 10. Frequency loop 12 receives a first input from node 13 which is transmitted to a first input of discriminator 20. The second input of discriminator 20 is coupled to the output of VCO 17. The first input of discriminator 20 is coupled to an input of a first polarity of summing junction 23. The second input of discriminator 20 is coupled to an input of a second polarity of summing junction 23. The output of summing junction 23 is dependent upon the difference in frequency between the two incoming signals. The output of summing junction 23 is then transmitted to gain constant 24 where it is amplified. The output of gain constant 24 is then provided to the output of discriminator 20. The output of discriminator 20 is coupled to the input of disable 21. Disable 21 operates to electrically disconnect frequency loop 12 from circuit 10 when the frequency of the feed back signal from VCO 17 is within the range PLL 11 is capable of handling. Disable 21 will be discussed in more detail in FIG. 2 below.

The output from disable 21 is provided to the input of an optional filter 22 where the noise is filtered. The output from filter 22 is then output from frequency loop 12 to a course adjusting input of PLL 11. Frequency loop 12 serves to adjust the output of VCO 17 to a range where PLL 11 can take over and maintain itself. Once the output of VCO 17 falls within this range, disable 21 disables frequency loop 12.

Figure 2:
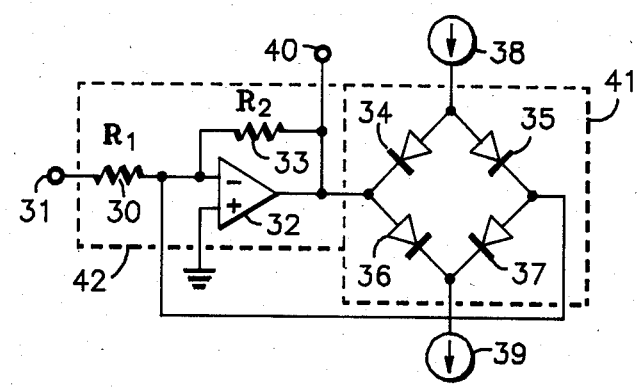
FIG. 2 is a schematic diagram of the disable circuit of the phase locked loop discriminator circuit of FIG. 1.

Referring now to FIG. 2, a schematic diagram of disable 21 of FIG. 2 is illustrated. Disable 21 consists of two basic portions: a sensing circuit 41 for sensing a range of voltage outputs from discriminator 20 and an output means 42 for providing an output voltage to PLL 11. Specifically, disable 21 consists of a first resistor 30 having a first end coupled to an input node 31, which is coupled to the output of discriminator 20, FIG. 1. The second end of resistor 30 is coupled to an input of a first polarity of an operational amplifier (Op Amp) 32. An input of a second polarity of Op Amp 32 is coupled to a ground. A second optional resistor 33 is coupled across Op Amp 32 from the input of a first polarity to the output.

The output of Op Amp 32 is coupled to the output of disable 21, at a node 40, which is coupled to the input of filter 22. The output of Op Amp 32 is also coupled to the cathode of a first diode 34 and to the anode of a third diode 36. The anode of diode 34 is coupled to the cathode of a second diode 35 and to the output of a first current generator 38. The cathode of diode 35 is coupled to the anode of a fourth diode 37 and to the input of a first polarity of Op Amp 32. The cathode of diode 37 is coupled to the cathode of diode 36 and to an input of a second current generator 39.

When the phase of the signal from VCO 17 is beyond the range PLL 11 is capable of handling, frequency loop 12 is active and a voltage signal, dependent upon the output of discriminator 20, is provided from disable 21. When the output of VCO 17 corresponds with the input signal, or when the output of VCO 17 is within a range PLL 11 can handle, disable 21 provides an output voltage of zero to PLL 11.

Figure 3:
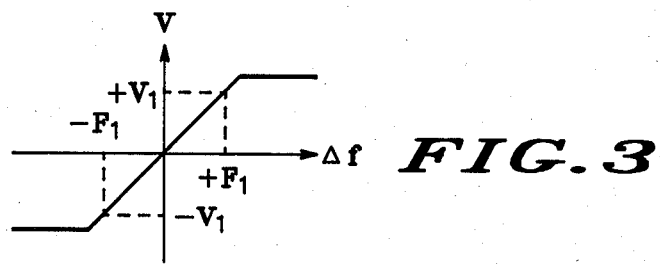
FIG. 3 is a graph of a frequency vs. voltage response curve of the discriminator circuit of FIG. 1.

The output of discriminator 20 is illustrated in FIG. 3. FIG. 3 shows a voltage vs. frequency (or frequency difference) graph. Discriminator 20 compares the frequency of an incoming signal, from node 13, with the frequency of the output signal from VCO 17. As shown by the graph, the larger the difference in frequencies, the larger the voltage output from discriminator 20. The points $-F_1$ and $+F_1$ represent the range within which PLL 11 can operate without the assistance of frequency loop 12. The voltage outputs $-V_1$ and $+V_1$ correspond to these frequencies.

Figure 4:
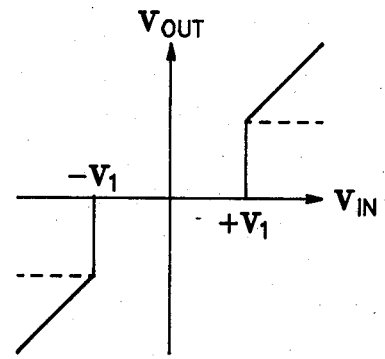
FIG. 4 is a graph of a output vs. input voltages for the disable circuit of FIGS. 1 and 2.

When the output voltage signal of discriminator 20 falls within this range disable 21 essentially turns off frequency loop 12 by providing a voltage output of zero to PLL 11. This is illustrated in the graph of FIG. 4. FIG. 4 shows the input $V_{in}$ and output $V_{out}$ voltage signals of disable 21. As shown here when the input voltage is between $-V_1$ and $+V_1$ the output voltage is zero. These voltage levels correspond to the voltage levels shown in FIG. 3. If optional resistor 33, FIG. 2, were eliminated, or made very large, then the output voltage of disable 21 would be represented by the dashed lines of FIG. 4.

Figure 5:
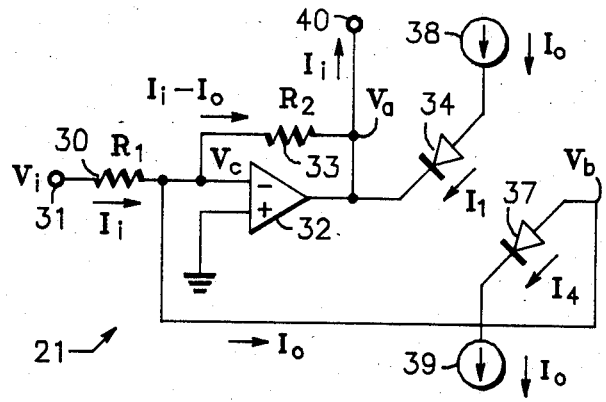
FIGS. 5–8 are schematic diagrams of the disable circuit of FIG. 1 under different operating conditions.

First, taking the example where the frequency difference is out side the range shown in FIG. 3, a voltage $V_i$ exceeding $+V_1$ is provided to node 31 of disable 21. This example is shown in FIG. 5. A voltage $V_c$ is fixed at the input of a first polarity of Op Amp 32. Voltage $V_c$ is approximately zero since the terminal of a second polarity of Op Amp 32 is grounded, or set to zero, and the inputs are set to follow each other by Op Amp 32. This causes a current, $I_i$, to be generated through resistor 30, having a resistance $R_1$, represented by:

$$I_i = V_i/R_1.$$

The current, $I_o$, in current generators 38 and 39 is set to a level equal to what the current through resistor 30 would be if the input voltage $V_1$, or $$I_o = V_1/R_1.$$

When $I_i$ is greater than $I_o$, the current level from resistor 30 to diode 37 is $I_o$ since the current is limited to $I_o$ by generator 38. The current $I_4$ through diode 35 is also $I_o$, for the same reason as above. This causes the current though diode 37 to be zero since $I_4 = I_2 + I_o$ and $I_4 = I_o$. This effectively eliminates diode 35, as has been shown in FIG. 5, from the circuit. In addition, since the current through diode 37 is $I_o$, the current through diode 36, FIG. 2, is also zero since $I_o = I_4 + I_3$ and $I_4 = I_o$. Again this effectively eliminating diode 36 as shown in FIG. 5. The current from current generator 38 is then passed entirely through diode 34 making $I_1$ equal to $I_o$ since $I_o = I_1 + I_2$ and $I_2 = 0$.

The current through resistor 33 is $I_i - I_o$ causing a voltage $V_a$ to be generated at output node 40 of disable 21. This output voltage is provided to summer 16 of PLL 11 where it is combined with the voltage output from phase detector 14.

Figure 6:
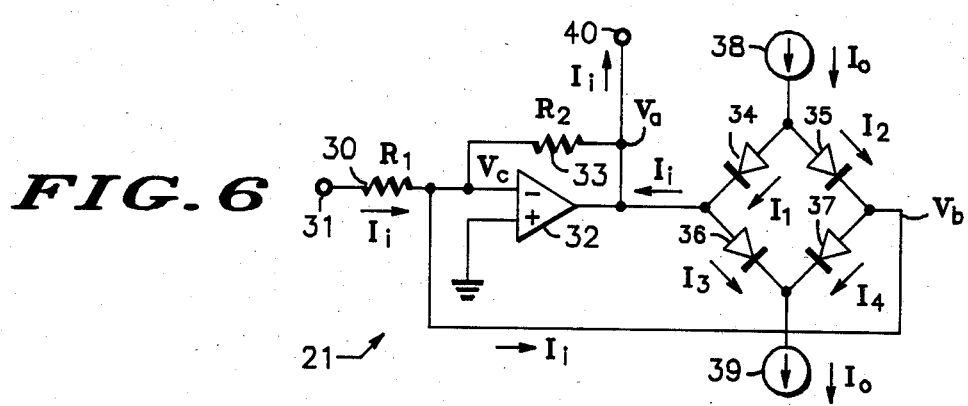

When the voltage from discriminator 20 is within the range of $+V_1$ to 0, disable 21 acts as shown in FIG. 6. This voltage causes an input current $I_i$ which is less than $I_o$. Since $I_i$ is less than $I_o$, all of the current is transmitted from resistor 30 to diode 37 and all of diodes 34–37 are on. The current through resistor 33 is zero since all of the current passing through resistor 30 is transmitted to diode 37. This makes voltage $V_a$ equal to voltage $V_c$ which is zero. Therefore, input voltage levels at node 31 between $V_1$ and 0 produce an output voltage to summer 16 of zero. Within this range frequency loop 12 has no effect on circuit 10.

Figure 7:
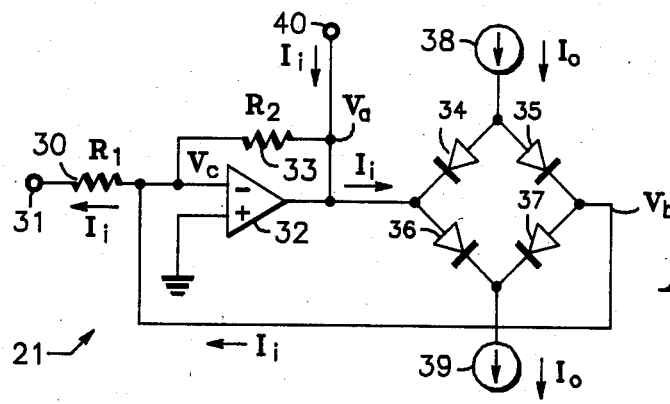

In FIG. 7, the schematic diagram for disable 21 is shown when the voltage at node 31 is between $-V_1$ and 0. This has the same result as described above in FIG. 6. Diodes 34–37 are all on. Current $I_i$ is output from diode 35 to resistor 30. There is no current passing through resistor 33 thereby making $V_a = V_c = 0$. In this case the output voltage provided to summer 16 is again zero.

Figure 8:
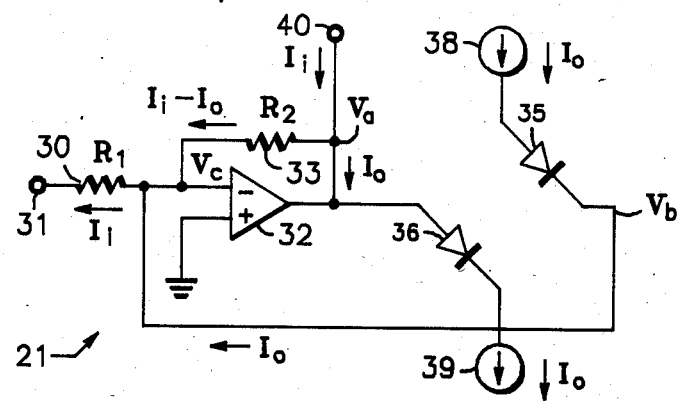

Referring now to FIG. 8, a schematic diagram of disable 21 where the input voltage at node 31 is less than $-V_1$ is illustrated. As shown, diodes 34 and 37 have no current passing through them and in effect are not present. The current passing through resistor 30, $I_i$, is more than $I_o$ from current generator 38. Therefore, the current through diode 35 is $I_o$ making the current through diode 34 zero. Since all of the current through diode 35 goes to resistor 30, the current through diode 37 is also zero. This requires that the current through diode 36 be $I_o$. Since the current through resistor 30 is $I_i$, which is larger than the current from diode 35 $I_o$, there is a current through diode 33 equal to $I_i - I_o$. This causes a voltage drop across resistor 33 of $V_a$ which is provided to summer 16.

Thus, it is apparent to one skilled in the art that there has been provided in accordance with the invention, a device and method that fully satisfies the objects, aims and advantages set forth above.

It has been shown that the present invention provides a phase locked loop discriminating circuit that requires fewer parts, takes less space and is more economical.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

I claim:

1. A disable circuit for use in a phase locked loop discriminator circuit, said phase locked loop discriminator circuit comprising (a) phase locked loop means for providing fine tuning in said phase locked loop discriminating circuit, said phase locked loop means having (i) a signal input coupled to a signal input of said phase locked loop discriminator circuit, (ii) an output, (iii) a fine adjusting input being coupled to said output of said phase locked loop means, and (iv) a course adjusting input, and (b) discriminator means for providing course tuning of said phase locked loop discriminating circuit said discriminator means having, (i) a signal input coupled to said signal input of said phase locked loop discriminator circuit, (ii) an adjusting input coupled to said output of said phase locked loop means, and (iii) an output, said disable circuit comprising:
  a first resistor having a first node coupled to said output of said discriminator means, and a second node;
  an operational amplifier having an input of a first polarity coupled to said second node of said first resistor, an input of a second polarity coupled to a ground, and an output coupled to said course adjusting input of said phase locked loop means;
  a first diode having an cathode coupled to said output of said operational amplifier, and a anode;
  a second diode having a anode coupled to said anode of said first diode and having an cathode coupled to said input of said first polarity of said operational amplifier;
  a third diode having a anode coupled to said output of said operational amplifier and an cathode;
  a fourth diode having a anode coupled to said cathode of said second diode, and an cathode coupled to said cathode of said third diode;
  a first current generator having an output coupled to said anodes of said first and second diodes; and
  a second current generator having an input coupled to said cathodes of said third and fourth diodes.

2. The disable circuit of claim 1 further comprising a second resistor having a first node coupled to said input of said first polarity of said operational amplifier and a second node coupled to said output of said operational amplifier.

3. A phase locked loop discriminating circuit having an signal input and comprising:
  phase locked loop means for providing fine tuning in said phase locked loop discriminating circuit, said phase locked loop means having a signal input coupled to said signal input of said phase locked loop circuit, an output, a fine adjusting input being coupled to said output of said phase locked loop means, and a course adjusting input;
  discriminator means for providing course tuning of said phase locked loop discriminating circuit said discriminator means having a signal input coupled to said signal input of said phase locked loop discriminator circuit, an adjusting input coupled to said output of said phase locked loop means, and an output; and
  disable means for disabling said discriminator means, said disable means having an input coupled to said output of said discriminator means and an output coupled to said course adjusting input of said phase locked loop means, said disable means comprising:
    sensing means for sensing a range of voltage outputs from said discriminator means; and
    output means for providing an output voltage to said course adjusting input of said phase locked loop means.

4. The phase locked loop discriminating circuit of claim 3 further comprising a first loop filter being coupled between said output of said disable means and said course adjusting input of said phase locked loop means.

5. The phase locked loop discriminating circuit of claim 3 wherein said phase locked loop means comprises:
  phase detector means for detecting differences in phase between a pair of input signals, said phase detector means having a first input coupled to said signal input of said phase locked loop discriminator circuit, a second input coupled to said output of said phase locked loop means, and an output;
  a second loop filter having an input coupled to said output of said phase detector means and an output;
  an adder having a first input coupled to said output of said second loop filter, a second input coupled to said output of said disable means, and an output; and
  a voltage controlled oscillator having an input coupled to said output of said adder and an output coupled to said fine adjusting input of said phase locked loop means and to said adjusting input of said discriminator means.

6. The phase locked loop discriminating circuit of claim 5 wherein said phase detector means comprises:
  a first summing junction having an input of a first polarity coupled to said signal input of said phase locked loop discriminator circuit, an input of a second polarity coupled to said output of said voltage controlled oscillator, and an output; and
  a first gain constant having an input coupled to said output of said first summing junction and an output coupled to said input of said second loop filter.

7. The phase locked loop discriminating circuit of claim 3 wherein said discriminator means comprises:
  a second summing junction having an input of a first polarity coupled to said signal input of said phase locked loop discriminator circuit, an input of a second polarity coupled to said output of said phase locked loop means, and an output; and
  a second gain constant having an input coupled to said output of said second summing junction and an output coupled to said input of said disable means.

8. The phase locked loop discriminating circuit of claim 3 wherein said disable means comprises:
  a first resistor having a first node coupled to said output of said discriminator means, and a second node;
  an operational amplifier having an input of a first polarity coupled to said second node of said first resistor, an input of a second polarity coupled to a ground, and an output coupled to said course adjusting input of said phase locked loop means;
  a first diode having an cathode coupled to said output of said operational amplifier, and a anode;
  a second diode having a anode coupled to said anode of said first diode and having an cathode coupled to said input of said first polarity of said operational amplifier;

a third diode having a anode coupled to said output of said operational amplifier and an cathode;
a fourth diode having a anode coupled to said cathode of said second diode, and an cathode coupled to said cathode of said third diode;
a first current generator having an output coupled to said anodes of said first and second diodes; and
a second current generator having an input coupled to said cathodes of said third and fourth diodes.

9. The phase locked loop discriminating circuit of claim 8 wherein said disable means further comprises a second resistor having a first node coupled to said input of said first polarity of said operational amplifier and a second node coupled to said output of said operational amplifier.

10. The phase locked loop discriminating circuit of claim 3 wherein said sensing means comprises:
a first diode having an cathode coupled to said output of said disable circuit and an anode;
a second diode having an anode coupled to said anode of said first diode and having a cathode coupled to said input of said disable means;
a third diode having an anode coupled to said cathode of said first diode and a cathode;
a fourth diode having an anode coupled to said cathode of said second diode, and an cathode coupled to said cathode of said third diode;
a first current generator having an output coupled to said anodes of said first and second diodes; and
a second current generator having an input coupled to said cathodes of said third and fourth diodes.

11. The phase locked loop discriminator circuit of claim 3 wherein said output means comprises:
a first resistor having a first node coupled to said input of said disable means and a second node coupled to said output of said disable means; and
an operational amplifier having an input of a first polarity coupled to said second node of said first resistor, an input of a second polarity coupled to a ground, and an output coupled to said output of said disable means.

12. A phase locked loop discriminating circuit having an signal input and comprising:
phase locked loop means for providing fine tuning in said phase locked loop discriminating circuit, said phase locked loop means having a signal input coupled to said signal input of said phase locked loop circuit, an output, a fine adjusting input being coupled to said output of said phase locked loop means, and a course adjusting input;
discriminator means for providing course tuning of said phase locked loop discriminating circuit said discriminator means having a signal input coupled to said input of said phase locked loop discriminator circuit, an adjusting input coupled to said output of said phase locked loop means, and an output;
a first resistor having a first node coupled to said output of said discriminator means, and a second node;
an operational amplifier having an input of a first polarity coupled to said second node of said first resistor, an input of a second polarity coupled to a ground, and an output coupled to said course adjusting input of said phase locked loop means;
a first diode having an cathode coupled to said output of said operational amplifier, and a anode;
a second diode having a anode coupled to said anode of said first diode and having an cathode coupled to said input of said first polarity of said operational amplifier;
a third diode having a anode coupled to said output of said operational amplifier and an cathode;
a fourth diode having a anode coupled to said cathode of said second diode, and an cathode coupled to said cathode of said third diode;
a first current generator having an output coupled to said anodes of said first and second diodes; and
a second current generator having an input coupled to said cathodes of said third and fourth diodes.

13. The phase locked loop discriminating circuit of claim 12 further comprising a first loop filter being coupled between said output of said operational amplifier and said course adjusting input of said phase locked loop means.

14. The phase locked loop discriminating circuit of claim 12 wherein said phase locked loop means comprises:
phase detector means for detecting differences in phase between a pair of input signals, said phase detector means having a first input coupled to said signal input of said phase locked loop discriminator circuit, a second input coupled to said output of said phase locked loop means, and an output;
a second loop filter having an input coupled to said output of said phase detector means and an output;
an adder having a first input coupled to said output of said second loop filter, a second input coupled to said output of said operational amplifier and an output; and
a voltage controlled oscillator having an input coupled to said output of said adder and an output coupled to said fine adjusting input of said phase locked loop means and to said adjusting input of said discriminator means.

15. The phase locked loop discriminator circuit of claim 14 wherein said phase detector means comprises:
a first summing junction having an input of a first polarity coupled to said signal input of said phase locked loop discriminator circuit, an input of a second polarity coupled to said output of said voltage controlled oscillator, and an output; and
a first gain constant having an input coupled to said output of said first summing junction and an output coupled to said input of said second loop filter.

16. The phase locked loop discriminating circuit of claim 12 wherein said discriminator means comprises:
a second summing junction having an input of a first polarity coupled to said signal input of said phase locked loop discriminator circuit, an input of a second polarity coupled to said output of said phase locked loop means, and an output; and
a second gain constant having an input coupled to said output of said second summing junction and an output coupled to said first node of said first resistor.

17. The phase locked loop discriminating circuit of claim 12 wherein said disable means further comprises a second resistor having a first node coupled to said input of said first polarity of said operational amplifier and a second node coupled to said output of said operational amplifier.

18. A phase locked loop discriminating circuit having a signal input and comprising:
phase locked loop means for providing fine tuning in said phase locked loop discriminating circuit, said phase locked loop means having a signal input coupled to said signal input of said phase locked loop circuit, an output, a fine adjusting input being coupled to said output of said phase locked loop means, and a course adjusting input;

a second summing junction having an input of a first polarity coupled to said signal input of said phase locked loop discriminator circuit, an input of a second polarity coupled to said output of said phase locked loop means, and an output;

a second gain constant having an input coupled to said output of said second summing junction and an output;

a first resistor having a first node coupled to said output of said second gain constant, and a second node;

an operational amplifier having an input of a first polarity coupled to said second node of said first resistor, an input of a second polarity coupled to a ground, and an output coupled to said course tuning input of said phase locked loop means;

a first diode having an cathode coupled to said output of said operational amplifier, and a anode;

a second diode having a anode coupled to said anode of said first diode and having an cathode coupled to said input of said first polarity of said operational amplifier;

a third diode having a anode coupled to said output of said operational amplifier and an cathode;

a fourth diode having a anode coupled to said cathode of said second diode, and an cathode coupled to said cathode of said third diode;

a first current generator having an output coupled to said anodes of said first and second diodes; and a second current generator having an input coupled to said cathodes of said third and fourth diodes.

19. The phase locked loop discriminating circuit of claim 18 further comprising a first loop filter being coupled between said output of said operational amplifier and said course adjusting input of said phase locked loop means.

20. The phase locked loop discriminating circuit of claim 18 wherein said phase locked loop means comprises:

phase detector means for detecting differences in phase between a pair of input signals, said phase detector means having a first input coupled to said signal input of said phase locked loop discriminator circuit, a second input coupled to said output of said phase locked loop means, and an output;

a second loop filter having an input coupled to said output of said phase detector means and an output;

an adder having a first input coupled to said output of said second loop filter, a second input coupled to said output of said operational amplifier, and an output; and a voltage controlled oscillator having an input coupled to said output of said adder and an output coupled to said fine adjusting input of said phase locked loop means and to said input of said second polarity of said second summing junction.

21. The phase locked loop discriminating circuit of claim 20 wherein said phase detector means comprises:

a first summing junction having an input of a first polarity coupled to said signal input of said phase locked loop discriminator circuit, an input of a second polarity coupled to said output of said voltage controlled oscillator, and an output; and a first gain constant having an input coupled to said output of said first summing junction and an output coupled to said input of said second loop filter.

22. The phase locked loop discriminating circuit of claim 18 further comprising a second resistor having a first node coupled to said input of said first polarity of said operational amplifier and a second node coupled to said output of said operational amplifier.

* * * * *